(12) United States Patent
Shi et al.

(10) Patent No.: US 12,283,964 B2
(45) Date of Patent: Apr. 22, 2025

(54) PHASE-LOCKED LOOP FREQUENCY SYNTHESIZER AND CONTROL METHOD THEREFOR

(71) Applicant: CHINAINSTRU & QUANTUMTECH (HEFEI) CO., LTD., Anhui (CN)

(72) Inventors: Zhifu Shi, Anhui (CN); Wei Zhang, Anhui (CN)

(73) Assignee: CHINAINSTRU & QUANTUMTECH (HEFEI) CO., LTD., Anhui (CN)

( * ) Notice: Subject to any disclaimer, the term of this patent is extended or adjusted under 35 U.S.C. 154(b) by 0 days.

(21) Appl. No.: 18/469,575

(22) Filed: Sep. 19, 2023

(65) Prior Publication Data

US 2024/0007115 A1 Jan. 4, 2024

Related U.S. Application Data

(63) Continuation of application No. PCT/CN2021/135775, filed on Dec. 6, 2021.

(30) Foreign Application Priority Data

May 25, 2021 (CN) .......................... 202110573491.9

(51) Int. Cl.
*H03L 7/099* (2006.01)
*H03L 7/093* (2006.01)

(52) U.S. Cl.
CPC ............ *H03L 7/0992* (2013.01); *H03L 7/093* (2013.01)

(58) Field of Classification Search
CPC ......... H04L 7/02; H04L 7/033; H04L 7/0331; H03L 7/23; H03L 7/16; H03L 7/18; H03L 7/1803; H03L 7/22; H03L 7/235
See application file for complete search history.

(56) References Cited

U.S. PATENT DOCUMENTS 6,255,912 B1   7/2001 Laub et al.
8,207,762 B2 *  6/2012 Burcea ............... H03K 5/15006
                                                        327/119

(Continued)

FOREIGN PATENT DOCUMENTS

CN      2746659 Y    12/2005
CN    202168070 U     3/2012

(Continued)

OTHER PUBLICATIONS

International Search Report dated Feb. 25, 2022 in International Application No. PCT/CN2021/135775. English translation attached.

(Continued)

*Primary Examiner* — Diana J. Cheng

(57) ABSTRACT

Provided are a phase-locked loop frequency synthesizer and control method therefor. The phase-locked loop frequency synthesizer includes: a voltage-controlled oscillator configured to generate a microwave signal; a directional coupler configured to: divide the microwave signal into a primary signal and a coupling signal, and transmit the primary signal into a transmitter of the paramagnetic resonance spectrometer to enter a resonator; an automatic frequency controller connected to the resonator and configured to: generate a first oscillation signal and a second oscillation signal, generate a frequency deviation signal, and generate a frequency setting signal based on the frequency deviation signal; and a phase-locked loop controller connected to the directional coupler, the voltage-controlled oscillator, and the automatic frequency controller and configured to: generate a low-phase-noise signal and control the voltage-controlled oscillator.

9 Claims, 4 Drawing Sheets

(56) References Cited

U.S. PATENT DOCUMENTS 10,564,308 B1 *  2/2020  Godoy ................... G01N 24/10
2011/0025328 A1   2/2011  Elliott et al.

FOREIGN PATENT DOCUMENTS

| CN | 105021885 A | 11/2015 |
| CN | 105790730 A | 7/2016 |
| CN | 113437969 A | 9/2021 |

OTHER PUBLICATIONS

The Grant Notice from corresponding Chinese Application No. 202110573491.9, dated Mar. 1, 2023. English translation attached.

* cited by examiner

PHASE-LOCKED LOOP FREQUENCY SYNTHESIZER AND CONTROL METHOD THEREFOR

CROSS-REFERENCE TO RELATED APPLICATION

The present application is a continuation of International Application No. PCT/CN2021/135775 filed on Dec. 6, 2021, which claims a priority to Chinese Patent Application No. 202110573491.9, titled "PHASE-LOCKED LOOP FREQUENCY SYNTHESIZER AND CONTROL METHOD THEREFOR", and filed on May 25, 2021, the entire disclosure of which is incorporated herein by reference.

FIELD

The present disclosure relates to the field of resonance spectrometer technologies, and more particularly, to a phase-locked loop frequency synthesizer and control method therefor.

BACKGROUND

In order to enable a wave source output frequency to track a resonant frequency of a resonator during obtaining an electron paramagnetic resonance spectrum, an Automatic Frequency Control (AFC) technology is proposed for a wave source controller in the related art, but the AFC technology can reduce a signal-to-noise ratio of a spectral line along with a deterioration of a phase noise of the wave source and cannot ensure that a wave source output signal has a sufficiently good phase waveform.

SUMMARY

Provided is a phase-locked loop frequency synthesizer, which allows a sample to absorb sufficient microwave signal energy while reducing a noise in a paramagnetic resonance spectrometer.

In a first aspect, the present disclosure provides a phase-locked loop frequency synthesizer. The phase-locked loop frequency synthesizer includes: a voltage-controlled oscillator configured to generate a microwave signal; a directional coupler connected to the voltage-controlled oscillator and configured to: divide the microwave signal into a primary signal and a coupling signal, and transmit the primary signal into a transmitter of the paramagnetic resonance spectrometer to enter a resonator; an automatic frequency controller connected to the resonator and configured to: generate a first oscillation signal and a second oscillation signal, generate a frequency deviation signal based on the second oscillation signal and a reflected signal of the resonator, and generate a frequency setting signal based on the frequency deviation signal, the frequency deviation signal comprising frequency deviation information between a frequency of the microwave signal and a frequency of the reflected signal; and a phase-locked loop controller connected to the directional coupler, the voltage-controlled oscillator, and the automatic frequency controller and configured to: generate a low-phase-noise signal and control the voltage-controlled oscillator based on the low-phase-noise signal, the coupling signal, the first oscillation signal, and the frequency setting signal to lock the frequency of the microwave signal to a resonant frequency of the resonator and reduce a phase noise of the microwave signal.

In the phase-locked loop frequency synthesizer according to embodiments of the present disclosure, an output frequency of the voltage-controlled oscillator can be locked to the resonant frequency of the resonator. Therefore, a sample can absorb sufficient microwave signal energy. Meanwhile, a phase distortion of an output signal of the voltage-controlled oscillator can be further reduced. Thus, a noise of the paramagnetic resonance spectrometer is reduced.

In addition, the above-mentioned phase-locked loop frequency synthesizer in the present disclosure may further include the following additional technical features.

According to an embodiment of the present disclosure, the phase-locked loop controller includes: a low-noise oscillator configured to generate the low-phase-noise signal; a phase-locked loop connected to the directional coupler, the low-noise oscillator, and the automatic frequency controller and configured to generate a control signal based on the low-phase-noise signal, the coupling signal, the first oscillation signal, and the frequency setting signal; and a first low-pass filter connected to the phase-locked loop and the voltage-controlled oscillator and configured to: filter the control signal and control the voltage-controlled oscillator by means of the filtered control signal.

According to an embodiment of the present disclosure, the phase-locked loop includes: a first frequency divider connected to the directional coupler and configured to divide a frequency of the coupling signal; a modulator connected to the automatic frequency controller and the first frequency divider and configured to control a frequency division ratio of the first frequency divider based on the first oscillation signal; a second frequency divider connected to the low-noise oscillator and the automatic frequency controller and configured to divide an ongoing frequency of the low-phase-noise signal, the second frequency divider being determined by the frequency setting signal; and a phase frequency detector connected to the first frequency divider, the second frequency divider, and the first low-pass filter and configured to generate the control signal based on the coupling signal subject to the frequency division and the low-phase-noise signal subject to the frequency division.

According to an embodiment of the present disclosure, the automatic frequency controller includes: a frequency detector connected to the resonator and the modulator and configured to: generate the first oscillation signal and the second oscillation signal and generate the frequency deviation signal based on the second oscillation signal and the reflected signal of the resonator; and a frequency setter connected to the frequency detector and the second frequency divider and configured to: generate the frequency setting signal based on the frequency deviation signal and control a frequency division ratio of the second frequency divider based on the frequency setting signal.

According to an embodiment of the present disclosure, the frequency detector includes: an oscillator connected to the modulator and configured to generate the first oscillation signal and the second oscillation signal; a detector connected to the resonator and configured to perform amplitude demodulation on the reflected signal to generate an amplitude signal; a multiplier connected to the detector and the oscillator and configured to perform multiplication of the amplitude signal and the second oscillation signal; a second low-pass filter connected to the multiplier and configured to perform a low-pass filtering processing on the outputted signal subject to the multiplication; and a Proportion Integration Differentiation (PID) controller connected to the second low-pass filter and the frequency setter and configured to perform PID adjustment on the signal subject to the low-pass filtering processing to generate the frequency deviation signal.

According to an embodiment of the present disclosure, when the phase-locked loop controller reaches a locked state, the frequency of the microwave signal is represented as $$f_{vco} = \frac{f_{ref}}{N_2} * N_1,$$

where:

$f_{ref}$ represents the frequency of the low-phase-noise signal;

$$N_1 = \frac{f_{in1}}{f_{out1}}$$

represents the frequency division ratio of the first frequency divider;

$$N_2 = \frac{f_{in2}}{f_{out2}}$$

represents a frequency division ratio of the second frequency divider;

$f_{in1}$ represents a frequency of an input signal of the first frequency divider:

$f_{out1}$ represents a frequency of an output signal of the first frequency divider;

$f_{in2}$ represents a frequency of an input signal of the second frequency divider; and $f_{out2}$ represents a frequency of an output signal of the second frequency divider;

According to an embodiment of the present disclosure, the first low-pass filter has a bandwidth of −3 dB.

According to an embodiment of the present disclosure, the first oscillation signal and the second oscillation signal have a same frequency and opposite phases with each other.

In a second aspect, the present disclosure provides a control method for a phase-locked loop frequency synthesizer. The method is configured to control the above-mentioned phase-locked loop frequency synthesizer. The method includes: dividing, by the directional coupler, the microwave signal generated by the voltage-controlled oscillator into the primary signal and the coupling signal, transmitting, by the directional coupler, the primary signal to the transmitter of the paramagnetic resonance spectrometer to enter the resonator, and transmitting, by the directional coupler, the coupling signal to the phase-locked loop controller; generating, by the automatic frequency controller, the first oscillation signal and the second oscillation signal, generating, by the automatic frequency controller, the frequency deviation signal based on the second oscillation signal and the reflected signal of the resonator, and generating, by the automatic frequency controller, the frequency setting signal based on the frequency deviation signal, the frequency deviation signal including the frequency deviation information between the frequency of the microwave signal and the frequency of the reflected signal; transmitting, by automatic frequency controller, the first oscillation signal and the frequency setting signal into the phase-locked loop controller; and generating, by the phase-locked loop controller, the low-phase-noise signal, coupling, by the phase-locked loop controller, an output frequency of a wave source to the low-noise oscillator inside the phase-locked loop, and controlling, by the phase-locked loop controller, the voltage-controlled oscillator based on the low-phase-noise signal, the coupling signal, the first oscillation signal, and the frequency setting signal, to lock the frequency of the microwave signal to the resonant frequency of the resonator and reduce the phase noise of the microwave signal.

In the control method for the phase-locked loop frequency synthesizer according to the present disclosure, the microwave signal generated by the voltage-controlled oscillator is divided by the directional coupler into the primary signal and the coupling signal, the primary signal is transmitted by the directional coupler to the transmitter of the paramagnetic resonance spectrometer to enter the resonator, and the coupling signal is transmitted by the directional coupler to the phase-locked loop controller. Then, the first oscillation signal and the second oscillation signal are generated by the automatic frequency controller, the frequency deviation signal is generated by the automatic frequency controller based on the second oscillation signal and the reflected signal of the resonator, and the frequency setting signal is generated by the automatic frequency controller based on the frequency deviation signal. The frequency deviation signal includes the frequency deviation information between the frequency of the microwave signal and the frequency of the reflected signal. Furthermore, the first oscillation signal and the frequency setting signal are transmitted by automatic frequency controller into the phase-locked loop controller. Then, the low-phase-noise signal is generated by the phase-locked loop controller, an output frequency of a wave source is coupled by the phase-locked loop controller to the low-noise oscillator inside the phase-locked loop, and the voltage-controlled oscillator is controlled by the phase-locked loop controller based on the low-phase-noise signal, the coupling signal, the first oscillation signal, and the frequency setting signal, to lock the frequency of the microwave signal to the resonant frequency of the resonator and reduce the phase noise of the microwave signal. In this way, an output frequency of the voltage-controlled oscillator can be locked to the resonant frequency of the resonator. Therefore, a sample can absorb sufficient microwave signal energy. Meanwhile, a phase distortion of an output signal of the voltage-controlled oscillator can be further reduced. Thus, a noise of the paramagnetic resonance spectrometer is reduced.

Additional aspects and advantages of the embodiments of present disclosure will be provided at least in part in the following description, or will become apparent in part from the following description, or can be learned from the practice of the embodiments of the present disclosure.

BRIEF DESCRIPTION OF THE DRAWINGS

The above and additional aspects and advantages of embodiments of the present disclosure will become apparent and more readily appreciated from the following descriptions made with reference to the accompanying drawings.

DETAILED DESCRIPTION

Figure 1:
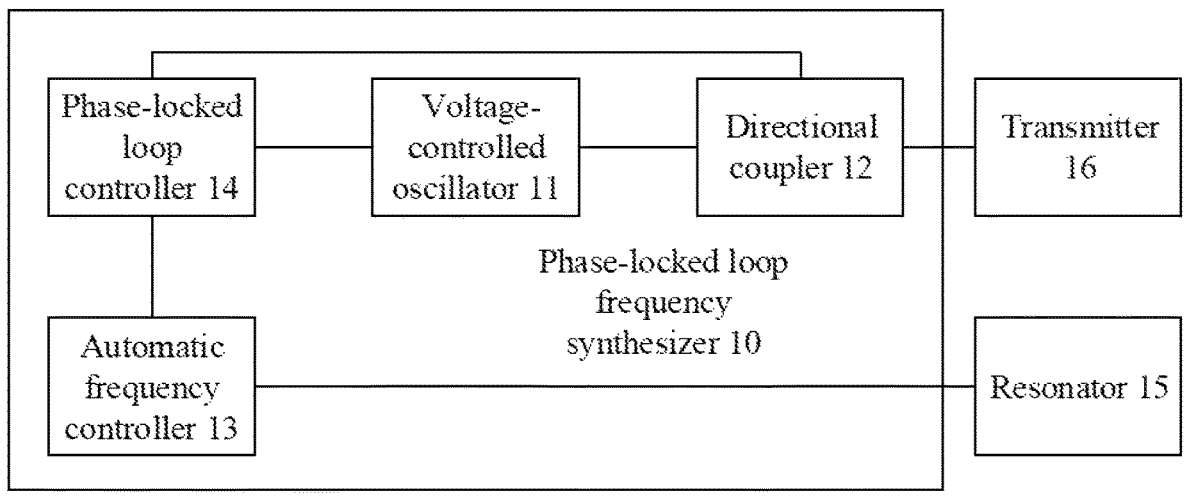
FIG. 1 is a block diagram of a structure of a phase-locked loop frequency synthesizer according to a first embodiment of the present disclosure.

Embodiments of the present disclosure are described in detail below, and the embodiments described with reference to the accompanying drawings are illustrative.

The embodiments of the present disclosure will be described in detail below with reference to examples thereof as illustrated in the accompanying drawings, throughout which same or similar elements, or elements having same or similar functions, are denoted by same or similar reference numerals. The embodiments described below with reference to the drawings are illustrative only, and are intended to explain rather than limit the present disclosure.

The phase-locked loop frequency synthesizer and control method therefor according to the embodiments of the present disclosure are described below with reference to the accompanying drawings.

FIG. 1 is a block diagram of a structure of a phase-locked loop frequency synthesizer according to an embodiment of the present disclosure.

As illustrated in FIG. 1, a phase-locked loop frequency synthesizer 10 includes a voltage-controlled oscillator 11, a directional coupler 12, an automatic frequency controller 13, and a phase-locked loop controller 14.

In an embodiment, the voltage-controlled oscillator 11 is configured to generate a microwave signal. The directional coupler 12 is connected to the voltage-controlled oscillator 11 and is configured to: divide the microwave signal into a primary signal and a coupling signal, and transmit the primary signal into a transmitter 16 of the paramagnetic resonance spectrometer to enter a resonator 15. An automatic frequency controller 13 is connected to the resonator 15 and is configured to: generate a first oscillation signal and a second oscillation signal, generate a frequency deviation signal based on the second oscillation signal and a reflected signal of the resonator 15, and generate a frequency setting signal based on the frequency deviation signal. The frequency deviation signal includes frequency deviation information between a frequency of the microwave signal and a frequency of the reflected signal. A phase-locked loop controller 14 is connected to the directional coupler 12, the voltage-controlled oscillator 11, and the automatic frequency controller 13 and is configured to: generate a low-phase-noise signal and control the voltage-controlled oscillator 11 based on the low-phase-noise signal, the coupling signal, the first oscillation signal, and the frequency setting signal to lock the frequency of the microwave signal to a resonant frequency of the resonator 15 and reduce a phase noise of the microwave signal.

The microwave signal generated by the above-mentioned voltage-controlled oscillator 11 is used to excite a sample placed in the resonator to produce a paramagnetic resonance signal after being transmitted to the transmitter 16 of the paramagnetic resonance spectrometer and transmitted to the resonator 15 through the transmitter 16. The above-mentioned first oscillation signal and the above-mentioned second oscillation signal have a same frequency and opposite phases with each other.

It should be noted that the above-mentioned voltage-controlled oscillator 11 has three ports of a power supply port, a microwave signal output port, and a frequency control port. The voltage-controlled oscillator 11 can achieve that the frequency of the microwave signal outputted by the voltage-controlled oscillator monotonically increases with a voltage of the above-mentioned frequency control port within a normal operation range.

Further, the above-mentioned directional coupler 13 has three ports of an input port, an output port, and a coupling port. The directional coupler 13 receives the microwave signal transmitted by the voltage-controlled oscillator through the input port, and performs attenuation on the microwave signal transmitted by the voltage-controlled oscillator to a certain extent, and then, outputs the attenuated signal through the output port. Meanwhile, the directional coupler 13 can further feed back a signal with a certain power through the coupling port to the phase-locked loop controller 14.

Figure 2:
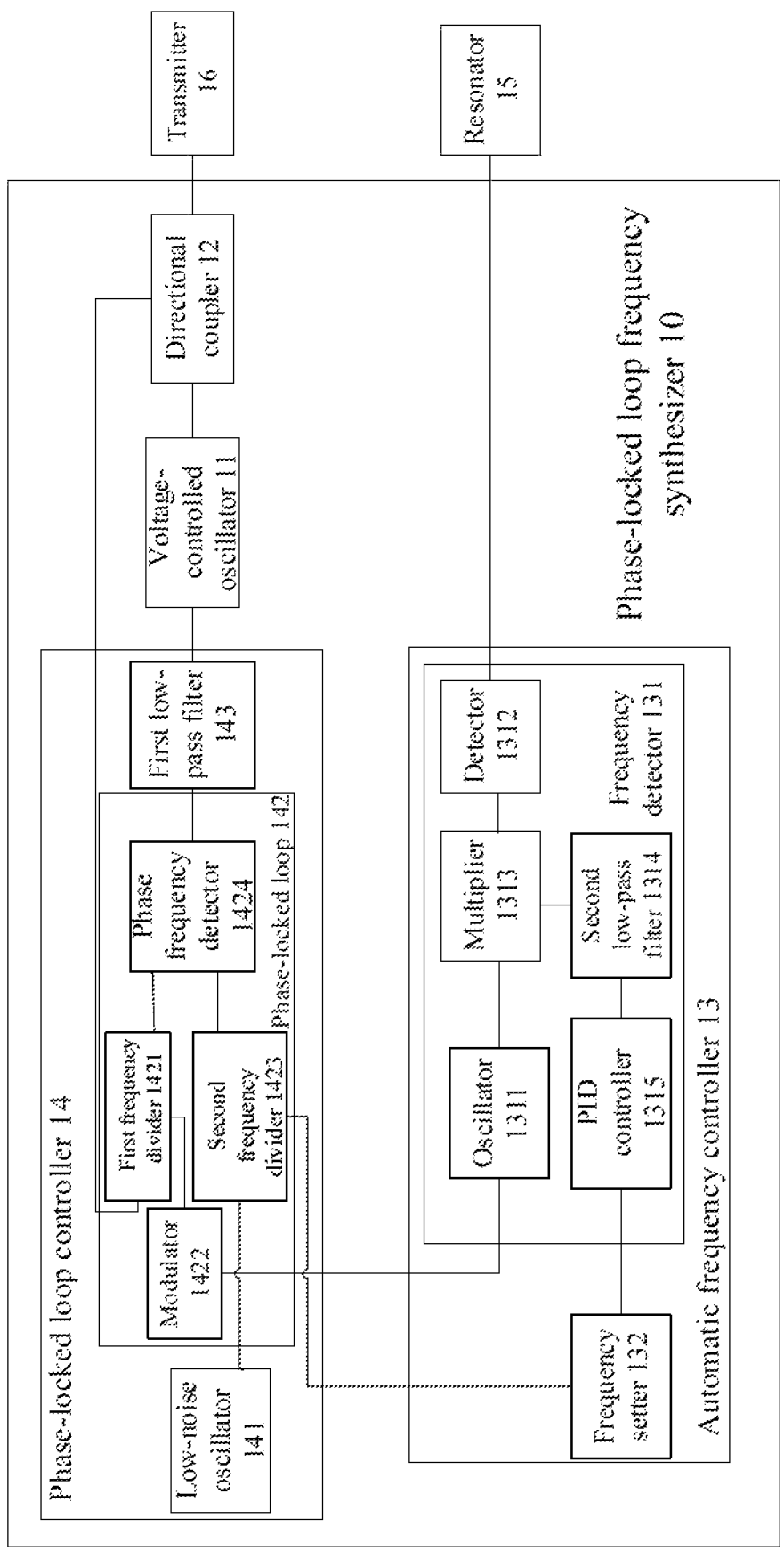
FIG. 2 is a block diagram of a structure of a phase-locked loop frequency synthesizer according to a second embodiment of the present disclosure.

Further, as illustrated in FIG. 2, the above-mentioned phase-locked loop controller 14 includes a low-noise oscillator 141, a phase-locked loop 142, and a first low-pass filter 143.

In an embodiment, the low-noise oscillator 141 is configured to generate the low-phase-noise signal; the phase-locked loop 142 is connected to the directional coupler 12, the low-noise oscillator 141, and the automatic frequency controller 13 and is configured to generate a control signal based on the low-phase-noise signal, the coupling signal, the first oscillation signal, and the frequency setting signal; and a first low-pass filter 143 is connected to the phase-locked loop 142 and the voltage-controlled oscillator 11 and is configured to: filter the control signal and control the voltage-controlled oscillator 11 by means of the filtered control signal.

As illustrated in FIG. 2, the above-mentioned phase-locked loop 142 includes a first frequency divider 1421, a modulator 1422, a second frequency divider 1423, and a phase frequency detector 1424.

In an embodiment, the first frequency divider 1421 is connected to the directional coupler 12 and is configured to divide a frequency of the coupling signal; the modulator 1422 is connected to the automatic frequency controller 13 and the first frequency divider 1421 and is configured to control a frequency division ratio of the first frequency divider 1421 based on the first oscillation signal; the second frequency divider 1423 is connected to the low-noise oscillator 141 and the automatic frequency controller 13 and is configured to divide an ongoing frequency of the low-phase-noise signal, in which the second frequency divider is determined by the frequency setting signal; and the phase frequency detector 1424 is connected to the first frequency divider 1421, the second frequency divider 1423, and the first low-pass filter 143 and is configured to generate the control signal based on the coupling signal subject to the frequency division and the low-phase-noise signal subject to the frequency division.

The above-mentioned first low-pass filter 143 has a bandwidth of −3 dB. The above-mentioned phase frequency detector 1424 has two input ports and one output port, which are configured to compare a difference between frequencies of input signals of the two input ports and output the difference to the first low-pass filter 143. The above-mentioned first low-pass filter 143 has the output port connected to the frequency control port of the above-mentioned voltage-controlled oscillator 11, thereby performing frequency modulation on an output signal of the voltage-controlled oscillator 11 based on a difference between a frequency of an output signal of the first frequency divider 1421 and a frequency of an output signal of the second frequency divider 1423. The input signal of the above-mentioned first divider 1421 is a signal fed back by the directional coupler 12, and the input signal of the above-mentioned second divider 1423 is the low-phase-noise signal outputted by the low-noise oscillator.

Therefore, the phase frequency detector 1424 can perform the frequency modulation on the output signal of the voltage-controlled oscillator 11 based on a difference between a frequency of a signal fed back to the first frequency divider 1421 from the directional coupler 12 and a frequency of the low-phase-noise signal outputted by the low-noise oscillator 141. Thus, phase coupling is realized between the output signal of the voltage-controlled oscillator 11 and the low-phase-noise signal outputted by the low-noise oscillator 141. As a result, a phase noise of the output signal of the voltage-controlled oscillator 11 is reduced.

Further, as illustrated in FIG. 2, the above-mentioned automatic frequency controller 13 includes a frequency detector 131 and a frequency setter 132.

In an embodiment, the frequency detector 131 is connected to the resonator 15 and the modulator 1422 and is configured to: generate the first oscillation signal and the second oscillation signal and generate the frequency deviation signal based on the second oscillation signal and the reflected signal of the resonator 15; and the frequency setter 132 is connected to the frequency detector 131 and the second frequency divider 1423 and is configured to: generate the frequency setting signal based on the frequency deviation signal and control a frequency division ratio of the second frequency divider based on the frequency setting signal.

As illustrated in FIG. 2, the above-mentioned frequency detector 131 includes an oscillator 1311, a detector 1312, a multiplier 1313, a second low-pass filter 1314, and a PID controller 1315.

In an embodiment, the oscillator 1311 is connected to the modulator 1422 and is configured to generate the first oscillation signal and the second oscillation signal; the detector 1312 is connected to the resonator 15 and is configured to perform amplitude demodulation on the reflected signal to generate an amplitude signal; the multiplier 1313 is connected to the detector 1312 and the oscillator 1311 and is configured to perform multiplication of the amplitude signal and the second oscillation signal; the second low-pass filter 1314 is connected to the multiplier 1313 and is configured to perform a low-pass filtering processing on the outputted signal subject to the multiplication; and the PID controller 1315 is connected to the second low-pass filter 1314 and the frequency setter 132 and is configured to perform PI) adjustment on the signal subject to the low-pass filtering processing to generate the frequency deviation signal.

Figure 3:
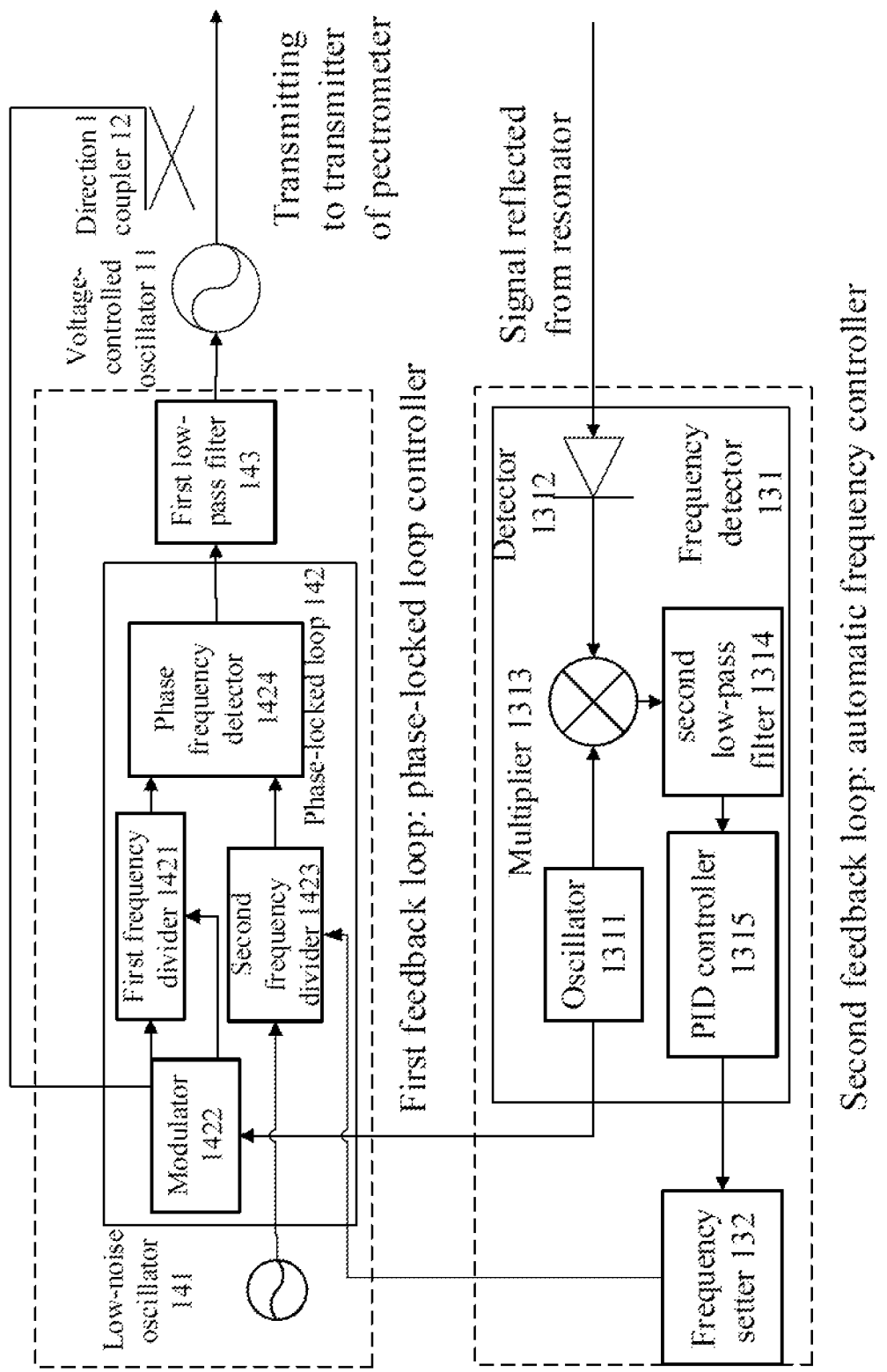
FIG. 3 is a schematic diagram of a phase-locked loop frequency synthesizer according to an embodiment of the present disclosure.

In an embodiment of the present disclosure, as illustrated in FIG. 3, the frequency detector 131 may be configured to obtain a frequency difference between a frequency of the output signal of the voltage-controlled oscillator 11 and the resonant frequency of the resonator 15, and then generate a signal carrying the frequency difference information. In an embodiment, a signal is outputted by the voltage-controlled oscillator 11 and transformed into an amplitude modulation signal after passing through the resonator 15. The amplitude modulation signal includes the frequency difference between the frequency of the output signal of the voltage-controlled oscillator 11 and the resonant frequency of the resonator 15. The detector 1312 is configured to perform amplitude demodulation on the amplitude modulation signal inputted into the detector 1312 to generate an amplitude signal, and then output the amplitude signal to the multiplier 1313. The multiplier 1313 is configured to perform multiplication of the second oscillation signal generated by the oscillator 1311 and the amplitude signal outputted by the detector 1312, and a result of the multiplication and the above-mentioned frequency deviation are in a one-to-one correspondence. The multiplier 1313 is configured to output the result of the multiplication to the second low-pass filter 1314 and the second low-pass filter 1314 is configured to filter the result of the multiplication, and output the filtered result to the PID controller 1315 to generate a signal carrying frequency deviation information. The signal carrying the frequency deviation information is transmitted to the frequency setter 132. The frequency setter 132 is configured to generate the frequency setting information and the frequency setting information is inputted to the phase-locked loop 142. The frequency division ratio of the second divider 1423 is controlled to set the output frequency of the voltage-controlled oscillator 11 and to further reduce the frequency deviation, which cycles until a lock state is reached. A sign of reaching the locked state may be that the frequency difference between the frequency of the output signal of the above-mentioned voltage controlled oscillator 11 and the resonant frequency of the above-mentioned resonator 15 is smaller than a predetermined threshold.

It should be noted that when the phase-locked loop controller 14 reaches a locked state, the frequency of the microwave signal is represented as $$f_{vco} = \frac{f_{ref}}{N_2} * N_1,$$

where:

$f_{ref}$ represents the frequency of the low-phase-noise signal;

$$N_1 = \frac{f_{in1}}{f_{out1}}$$

represents the frequency division ratio of the first frequency divider 1421;

$$N_2 = \frac{f_{in2}}{f_{out2}}$$

represents a frequency division ratio of the second frequency divider 1423;

$f_{in1}$ represents a frequency of an input signal of the first frequency divider 1421;

$f_{out1}$ represents a frequency of an output signal of the first frequency divider 1421;

$f_{in2}$ represents a frequency of an input signal of the second frequency divider 1423; and $f_{out2}$ represents a frequency of an output signal of the second frequency divider 1423.

Therefore, the output frequency of the voltage-controlled oscillator 11 may be set based on the resonant frequency of the resonator. Thus, the output frequency of the voltage-controlled oscillator is locked to the resonant frequency of the resonator.

It should be noted that the above-mentioned phase-locked loop 14 may be configured to adjust the output frequency of the voltage-controlled oscillator 11 based on an externally connected input signal, and a modulation rate $f_m$ and a modulation depth $f_{dev}$ may be adjustable. For example, a first oscillation signal outputted by the oscillator 1311 may be received by the modulator 1422 in the phase-locked loop 14 and is a high-low level signal with a periodical variation. When a high level signal is received, a value of $N_1$ is controlled by the modulator 1422 to be $N_{11}$, thereby enabling the output frequency of the voltage-controlled oscillator 11 to be $$f_1 = \frac{f_{ref}}{N_2} * N_{11};$$

and when a signal is at a low level, the value of $N_1$ is controlled by the modulator 1422 to be $N_{11}$, thereby enabling the output frequency of the voltage-controlled oscillator 11 to be $$f_0 = \frac{f_{ref}}{N_2} * N_{10}.$$

As the above-mentioned high-low level signal appears with the periodical variation at the high and low levels, the output frequency of the voltage-controlled oscillator also varies periodically in accordance with $f_1$ to $f_0$, thereby achieving frequency modulation. The modulation rate $f_m$ is determined by a period of the above-mentioned high-low level signal, and the modulation depth $f_{dev}$ is determined by the modulator, both of which are adjustable.

Therefore, the first oscillation signal is outputted by the oscillator 1311 to the phase-locked loop 142 to perform the frequency modulation of the output signal of the voltage-controlled oscillator 11. The signal subject to the frequency modulation is outputted by the voltage-controlled oscillator 11 and is transformed into an amplitude modulation signal after passing through the resonator 15. The amplitude modulation signal includes the frequency difference between the frequency of the output signal of the voltage-controlled oscillator 11 and the resonant frequency of the resonator 15. Thus, the automatic frequency controller 13 can lock the output frequency of the voltage-controlled oscillator to the resonant frequency of the resonator by means of the amplitude modulation signal.

In an embodiment of the present disclosure, the low-noise oscillator 141 in the phase-locked loop 14 may be replaced with a low-noise voltage-controlled oscillator. A periodic alternating voltage signal from an external input is received by the low-noise voltage-controlled oscillator, such that a value of $f_{ref}$ varies periodically, and a value of $f_{vco}$ further varies periodically. As a result, the frequency modulation is performed on the output signal of the voltage-controlled oscillator 11, and the modulation rate and modulation depth may be adjusted by the above-mentioned external signal.

In summary, in the phase-locked loop frequency synthesizer according to the embodiments of the present disclosure, the output frequency of the voltage-controlled oscillator can be locked to the resonant frequency of the resonator. Therefore, the sample can absorb sufficient microwave signal energy. Meanwhile, a phase distortion of the output signal of the voltage-controlled oscillator can be further reduced. Thus, a noise of the paramagnetic resonance spectrometer is reduced.

Figure 4:
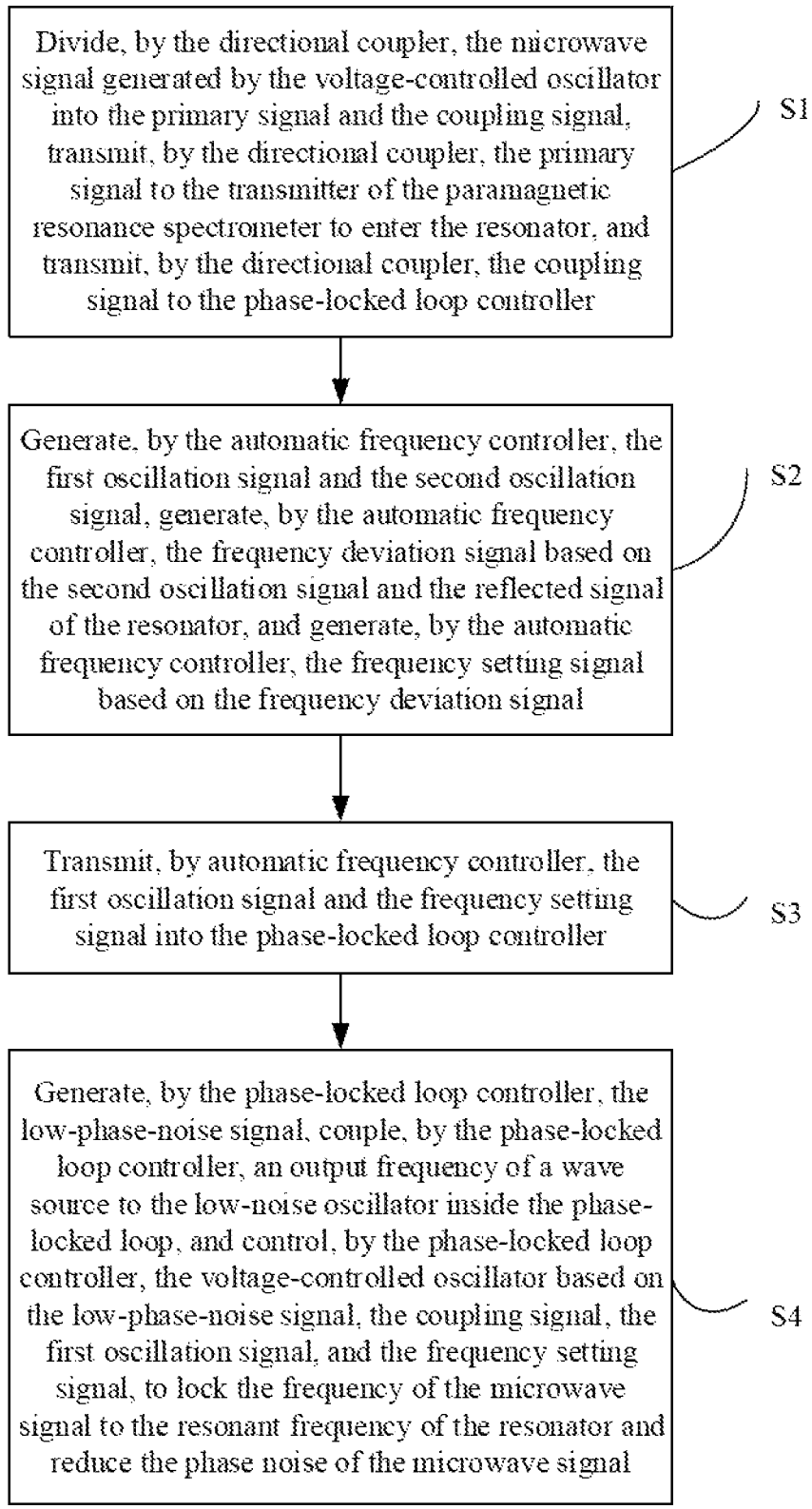
FIG. 4 is a flowchart of a control method for a phase-locked loop frequency synthesizer according to an embodiment of the present disclosure.

FIG. 4 is a flowchart of a control method for a phase-locked loop frequency synthesizer according to an embodiment of the present disclosure.

In the embodiment, the control method for the phase-locked loop frequency synthesizer is applied to the above-mentioned the phase-locked loop frequency synthesizer.

As illustrated in FIG. 4, the phase-locked loop frequency synthesizer includes actions at block S1 to S4.

At block S1, the microwave signal generated by the voltage-controlled oscillator is divided by the directional coupler into the primary signal and the coupling signal, the primary signal is transmitted by the directional coupler to the transmitter of the paramagnetic resonance spectrometer to enter the resonator, and the coupling signal is transmitted by the directional coupler to the phase-locked loop controller.

In an embodiment, the directional coupler is a power distribution device with three ports. The three ports are an input port, an output port, and a coupling port. The microwave signal generated by the voltage-controlled oscillator is inputted to the input port of the directional coupler, and a signal subjected to certain attenuation and outputted from the output port enters the transmitter of the spectrometer, and then enters the resonator to excite the sample. Meanwhile, a signal with a certain power is outputted from a coupling output port of the directional coupler and is fed back to the phase-locked loop.

At block S2, the first oscillation signal and the second oscillation signal are generated by the automatic frequency controller, the frequency deviation signal is generated by the automatic frequency controller based on the second oscillation signal and the reflected signal of the resonator, and the frequency setting signal is generated by the automatic frequency controller based on the frequency deviation signal.

The automatic frequency controller is composed of the frequency setter and the frequency detector. The frequency detector is composed of an oscillator, a multiplier, a detector, a second low-pass filter, and a PID controller.

The frequency detector is configured to generate a signal carrying frequency deviation information. An operation principle of the frequency detector is as follows. A first oscillator signal and a second oscillator signal are generated by the oscillator. The detector is configured to perform amplitude modulation demodulation on an amplitude modulation signal inputted to the detector to generate an amplitude signal. Multiplication of the second oscillation signal generated by the oscillator and the amplitude signal outputted by the detector is performed, and the result of the multiplication passes through a second low-pass filter to output a signal having a one-to-one correspondence with the above-mentioned frequency deviation. The output signal of the second low-pass filter enters the PID controller to generate a signal carrying frequency deviation information. The deviation signal is transmitted to a frequency setter. The frequency setter is configured to generate frequency setting information.

The frequency deviation signal includes the frequency deviation information between the frequency of the microwave signal and the frequency of the reflected signal.

At block S3, the first oscillation signal and the frequency setting signal are transmitted by automatic frequency controller into the phase-locked loop controller.

In an embodiment, the first oscillation signal generated by the oscillator is outputted to the phase-locked loop, and frequency modulation is performed on the output signal of the voltage-controlled oscillator at a modulation rate of $f_m$. The frequency modulation signal is transformed into an amplitude modulation signal after passing through the resonator. The frequency setting signal is inputted to the phase-locked loop controller to set the output frequency of the voltage-controlled oscillator and to further reduce the frequency deviation, which circles until a locked state is reached. The frequency deviation is smaller than a set threshold when being locked.

At block S4, the low-phase-noise signal is generated by the phase-locked loop controller, an output frequency of a wave source is coupled by the phase-locked loop controller to the low-noise oscillator inside the phase-locked loop, and the voltage-controlled oscillator is controlled by the phase-locked loop controller based on the low-phase-noise signal, the coupling signal, the first oscillation signal, and the frequency setting signal, to lock the frequency of the microwave signal to the resonant frequency of the resonator and reduce the phase noise of the microwave signal.

It should be noted that other specific implementations of the control method for the phase-locked loop frequency synthesizer according to the embodiments of the present disclosure can refer to the phase-locked loop frequency synthesizer described above.

In summary, in the phase-locked loop frequency synthesizer according to the embodiments of the present disclosure, the output frequency of the voltage-controlled oscillator can be locked to the resonant frequency of the resonator. Therefore, the sample can absorb sufficient microwave signal energy. Meanwhile, the phase distortion of the output signal of the voltage-controlled oscillator can be further reduced. Thus, the noise of the paramagnetic resonance spectrometer is reduced.

It should be noted that, the logic and/or step described in other manners herein or shown in the flowchart, for example, a particular sequence table of executable instructions for realizing the logical function, may be specifically achieved in any computer readable medium to be used by the instruction execution system, apparatus or device (such as the system based on computers, the system comprising processors or other systems capable of obtaining the instructions from the instruction execution system, apparatus and device and executing the instructions), or to be used in combination with the instruction execution system, apparatus and device. As to the specification, "the computer readable medium" may be any apparatus adaptive for including, storing, communicating, propagating or transmitting programs to be used by or in combination with the instruction execution system, apparatus or device. More specific examples of the computer readable medium include but are not limited to: an electronic connection (an electronic apparatus) with one or more wires, a portable computer enclosure (a magnetic apparatus), a random access memory (RAM), a read only memory (ROM), an erasable programmable read-only memory (EPROM or a flash memory), an optical fiber apparatus and a portable compact disk read-only memory (CDROM). In addition, the computer readable medium may even be a paper or other appropriate medium capable of printing programs thereon, because, for example, the paper or other appropriate medium may be optically scanned and then edited, decrypted or processed with other appropriate methods when necessary to obtain the programs in an electric manner, and then the programs may be stored in the computer memories.

It should be understood that each part of the present disclosure may be realized by the hardware, software, firmware or a combination thereof. In the above embodiments, a plurality of steps or methods may be realized by the software or firmware stored in the memory and executed by the appropriate instruction execution system. For example, if it is realized by the hardware, likewise in another embodiment, the steps or methods may be realized by one or a combination of the following techniques known in the art; a discrete logic circuit having a logic gate circuit for realizing a logic function of a data signal, an application-specific integrated circuit having an appropriate combination logic gate circuit, a programmable gate array (PGA), a field programmable gate array (FPGA), etc.

In the description of this specification, descriptions with reference to the terms "an embodiment", "some embodiments", "an exemplary embodiment", "an example", "a specific example", or "some examples" etc., mean that specific features, structures, materials or characteristics described in conjunction with the embodiment or example are included in at least one embodiment or example of the present disclosure. In this specification, the schematic representations of the above terms do not necessarily refer to the same embodiment or example.

Although embodiments of the present disclosure have been illustrated and described, it is conceivable for those of ordinary skill in the art that various changes, modifications, replacements, and variations can be made to these embodiments without departing from the principles and spirit of the present disclosure. The scope of the present disclosure shall be defined by the claims as appended and their equivalents.

What is claimed is:

1. A phase-locked loop frequency synthesizer, applied in a paramagnetic resonance spectrometer and comprising:
   a voltage-controlled oscillator configured to generate a microwave signal;
   a directional coupler connected to the voltage-controlled oscillator and configured to: divide the microwave signal into a primary signal and a coupling signal, and transmit the primary signal into a transmitter of the paramagnetic resonance spectrometer to enter a resonator;
   an automatic frequency controller connected to the resonator and configured to: generate a first oscillation signal and a second oscillation signal, generate a frequency deviation signal based on the second oscillation signal and a reflected signal of the resonator, and generate a frequency setting signal based on the frequency deviation signal, wherein the frequency deviation signal comprises frequency deviation information between a frequency of the microwave signal and a frequency of the reflected signal; and
   a phase-locked loop controller connected to the directional coupler, the voltage-controlled oscillator, and the automatic frequency controller and configured to:
   generate a low-phase-noise signal and control the voltage-controlled oscillator based on the low-phase-noise signal, the coupling signal, the first oscillation signal, and the frequency setting signal to lock the frequency of the microwave signal to a resonant frequency of the resonator and reduce a phase noise of the microwave signal.

2. The phase-locked loop frequency synthesizer according to claim 1, wherein the phase-locked loop controller comprises:
   a low-noise oscillator configured to generate the low-phase-noise signal;
   a phase-locked loop connected to the directional coupler, the low-noise oscillator, and the automatic frequency controller and configured to generate a control signal based on the low-phase-noise signal, the coupling signal, the first oscillation signal, and the frequency setting signal; and a first low-pass filter connected to the phase-locked loop and the voltage-controlled oscillator and configured to: filter the control signal and control the voltage-controlled oscillator by means of the filtered control signal.

3. The phase-locked loop frequency synthesizer according to claim 2, wherein the phase-locked loop comprises:
a first frequency divider connected to the directional coupler and configured to divide a frequency of the coupling signal;
a modulator connected to the automatic frequency controller and the first frequency divider and configured to control a frequency division ratio of the first frequency divider based on the first oscillation signal;
a second frequency divider connected to the low-noise oscillator and the automatic frequency controller and configured to divide an ongoing frequency of the low-phase-noise signal, wherein the second frequency divider is determined by the frequency setting signal; and
a phase frequency detector connected to the first frequency divider, the second frequency divider, and the first low-pass filter and configured to generate the control signal based on the coupling signal subject to the frequency division and the low-phase-noise signal subject to the frequency division.

4. The phase-locked loop frequency synthesizer according to claim 3, wherein the automatic frequency controller comprises:
a frequency detector connected to the resonator and the modulator and configured to: generate the first oscillation signal and the second oscillation signal and generate the frequency deviation signal based on the second oscillation signal and the reflected signal of the resonator; and
a frequency setter connected to the frequency detector and the second frequency divider and configured to: generate the frequency setting signal based on the frequency deviation signal and control a frequency division ratio of the second frequency divider based on the frequency setting signal.

5. The phase-locked loop frequency synthesizer according to claim 4, wherein the frequency detector comprises:
an oscillator connected to the modulator and configured to generate the first oscillation signal and the second oscillation signal;
a detector connected to the resonator and configured to perform amplitude demodulation on the reflected signal to generate an amplitude signal;
a multiplier connected to the detector and the oscillator and configured to perform multiplication of the amplitude signal and the second oscillation signal;
a second low-pass filter connected to the multiplier and configured to perform a low-pass filtering processing on the outputted signal subject to the multiplication; and
a Proportion Integration Differentiation (PID) controller connected to the second low-pass filter and the frequency setter and configured to perform PID adjustment on the signal subject to the low-pass filtering processing to generate the frequency deviation signal.

6. The phase-locked loop frequency synthesizer according to claim 3, wherein when the phase-locked loop controller reaches a locked state, the frequency of the microwave signal is represented as $$f_{vco} = \frac{f_{ref}}{N_2} * N_1,$$

where:
$f_{ref}$ represents the frequency of the low-phase-noise signal;

$$N_1 = \frac{f_{in1}}{f_{out1}}$$

represents the frequency division ratio of the first frequency divider;

$$N_2 = \frac{f_{in2}}{f_{out2}}$$

represents a frequency division ratio of the second frequency divider;
$f_{in1}$ represents a frequency of an input signal of the first frequency divider;
$f_{out1}$ represents a frequency of an output signal of the first frequency divider;
$f_{in2}$ represents a frequency of an input signal of the second frequency divider; and
$f_{out2}$ represents a frequency of an output signal of the second frequency divider.

7. The phase-locked loop frequency synthesizer according to claim 2, wherein the first low-pass filter has a bandwidth of −3 dB.

8. The phase-locked loop frequency synthesizer according to claim 1, wherein the first oscillation signal and the second oscillation signal have a same frequency and opposite phases with each other.

9. A control method for a phase-locked loop frequency synthesizer, the method being configured to control the phase-locked loop frequency synthesizer according to claim 1 and comprising:
dividing, by the directional coupler, the microwave signal generated by the voltage-controlled oscillator into the primary signal and the coupling signal, transmitting, by the directional coupler, the primary signal to the transmitter of the paramagnetic resonance spectrometer to enter the resonator, and transmitting, by the directional coupler, the coupling signal to the phase-locked loop controller;
generating, by the automatic frequency controller, the first oscillation signal and the second oscillation signal, generating, by the automatic frequency controller, the frequency deviation signal based on the second oscillation signal and the reflected signal of the resonator, and generating, by the automatic frequency controller, the frequency setting signal based on the frequency deviation signal, wherein the frequency deviation signal comprises the frequency deviation information between the frequency of the microwave signal and the frequency of the reflected signal;
transmitting, by automatic frequency controller, the first oscillation signal and the frequency setting signal into the phase-locked loop controller; and
generating, by the phase-locked loop controller, the low-phase-noise signal, coupling, by the phase-locked loop controller, an output frequency of a wave source to the low-noise oscillator inside the phase-locked loop, and controlling, by the phase-locked loop controller, the voltage-controlled oscillator based on the low-phase-noise signal, the coupling signal, the first oscillation signal, and the frequency setting signal, to lock the frequency of the microwave signal to the resonant frequency of the resonator and reduce the phase noise of the microwave signal.

\* \* \* \* \*